(12) United States Patent
Beguin et al.

(10) Patent No.: US 6,545,477 B1
(45) Date of Patent: Apr. 8, 2003

(54) METHOD AND APPARATUS FOR DETERMINING THE RESISTIVITY OF A FORMATION THROUGH WHICH A CASED WELL PASSES

(75) Inventors: Paul Beguin, Sugar Land, TX (US); Dominique Benimeli, Chatillon (FR); Patrick Ehret, Herblay (FR); Francois Hecquet, Montgeron (FR); Peter Van Der Wal, Issy les Moulineaux (FR); Marie-Therese Gounot, Le Vesinet (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 09/980,544

(22) PCT Filed: Apr. 21, 2000

(86) PCT No.: PCT/EP00/03748
§ 371 (c)(1),
(2), (4) Date: Mar. 5, 2002

(87) PCT Pub. No.: WO00/67047
PCT Pub. Date: Nov. 9, 2000

(30) Foreign Application Priority Data

Apr. 28, 1999 (FR) .............................. 99 05340

(51) Int. Cl.$^7$ ................................. G01V 3/02
(52) U.S. Cl. ..................................... 324/368
(58) Field of Search .................... 324/347, 368–375

(56) References Cited

U.S. PATENT DOCUMENTS

| | | | | | |
|---|---|---|---|---|---|
| 2,459,196 A | * | 1/1949 | Stewart | ................ | 324/368 |
| 2,729,784 A | * | 1/1956 | Fearon | ................ | 324/368 |
| 4,796,186 A | * | 1/1989 | Kaufman | ................ | 702/7 |
| 4,820,989 A | * | 4/1989 | Vail, III | ................ | 324/368 |
| 5,563,514 A | * | 10/1996 | Moulin | ................ | 324/368 |

* cited by examiner

*Primary Examiner*—Jay Patidar
(74) *Attorney, Agent, or Firm*—Brigitte L. Jeffery

(57) ABSTRACT

The invention relates to a method of surveying a geological formation through which a cased borehole passes, said method being characterized by the fact that:

in a first step, current is injected into the casing (11) at a first point (In1) spaced apart longitudinally from said formation so as to cause current to leak into said formation, and electrodes (a, b, c) defining two consecutive sections of casing situated at the level of said formation ,ire used to measure the respective potential drops along said sections;

in a second step, current is injected into the casing at a second point (In2) spaced apart longitudinally from the formation and situated on the opposite side thereof from said first point, so as to cause current to leak into the formation, and said electrodes are used to measure the potential drops along said sections;

the corresponding measurements of the two steps are combined to obtain the values corresponding to a circuit formed by the casing between the two injection points is and essentially exempt from leakage into the formation; and the current leakage that is indicative of the resistivity of the formation is determined on the basis of the measurements taken in the first step and in the second step, and of the values resulting from said combination.

2 Claims, 3 Drawing Sheets

METHOD AND APPARATUS FOR DETERMINING THE RESISTIVITY OF A FORMATION THROUGH WHICH A CASED WELL PASSES

BACKGROUND OF THE INVENTION

1. Field of the Invention

The invention relates to determining the resistivity of geological formations through which a well provided with metal casing passes.

2. Description of the Related Prior Art

The importance of resistivity logging for oil prospecting is well known. It is known that the resistivity of a formation depends essentially on the fluid that it contains. A formation containing salt water, which is conductive, has resistivity that is much lower than a formation filled with hydrocarbons, and therefore resistivity measurements are of irreplaceable value for locating hydrocarbon deposits, Resistivity logging has been performed widely and for many years, in particular by means of apparatus having electrodes, but existing techniques have a field of application that is limited to wells that are not cased, or "open holes" as they are referred to in oil industry terminology. The presence in the well of metal casing, which has resistivity that is minute compared with typical values for geological formations (about $2 \times 10^{-7}$ ohm·m for steel casing compared with values in the range 1 ohm·m to 1000 ohm·m for a formation), represents a considerable barrier to sending electrical currents into the formations surrounding the casing. As a result, in particular, it is not possible to obtain resistivity measurements in wells that are in production, since such wells are provided with casing.

It would therefore be very advantageous to make it possible to measure resistivity in sections of cased wells. Such measurements, taken in a well in production at the level of the deposit, would make it possible to locate the water-hydrocarbon interfaces and thus to monitor how the positions of such interfaces vary over time, so as to monitor the behavior of the hydrocarbon reservoir and so as to optimize extraction therefrom. It would also be possible to obtain a resistivity measurement in a well (or a well section) for which no measurements were taken before the casing was put into place, in particular in order to supplement knowledge of the reservoir, and optionally to detect productive layers that were not located initially.

Proposals have been made on this subject in the literature. The basic measurement principle presented in Patent Document U.S. Pat. No. 2,459,196 consists in causing a current to flow along the casing under conditions such that current leaks out or is lost to the formation. Such loss is a function of the resistivity of the formation: the more the formation is conductive, the greater the current loss. By measuring current loss, it is possible to determine the resistivity of the formation. Current loss can be evaluated by measuring the voltage drop between electrodes placed at different depths in the well. Patent Document U.S. Pat. No. 2,729,784 describes a measurement method using two pairs of measurement electrodes a,b and b,c spaced apart along the casing, the electrodes a and c being in principle equidistant from the electrode b. Current electrodes are placed on either side of the measurement electrodes, so as to inject currents into the casing in opposite directions. A feedback loop servo-controls the injected current so as to put the is external measurement electrodes at the same potential, so as to cancel out the effect of the resistance of the casing varying in the sections (a,b) and (b,c) as defined by the measurement electrodes. A value for the leakage current at the level of the central electrode b is obtained by measuring the voltage drop across each of the pairs of electrodes a,b and b,c, and by taking the difference between the voltage drops, which difference is stated to be proportional to the leakage current.

French Patent Document 2 207 278 provides the use of three measurement electrodes spaced apart uniformly as in Patent Document U.S. Pat. No. 2,729,784 for measuring current leakage, and it describes a method in two steps: a first step for measuring the resistance of the casing section defined by the external measurement electrodes, during which step current is caused to flow along the casing so that there is no leakage into the formation; and a second step during which current can leak to the formation. For that purpose, a current injection system is provided that comprises one emission electrode and two return electrodes, a near one of the measurement electrodes being active during the first step, and the other measurement electrode being situated at the surface and being active during the second step.

Patent Document U.S. Pat. No. 4,796,186 describes a method in two steps of the same type as the method described in above-mentioned French Patent Document 2 207 278, and using the same electrode configuration. It provides a circuit for cancelling out the effect of resistance varying between the two sections of casing. That circuit comprises amplifiers connected to each pair of measurement electrodes so as to deliver respective voltage drops at their outputs. One of the amplifiers is a variable-gain amplifier, its gain being adjusted during the first step so as to cancel out the difference between the outputs or the amplifiers. Patent Document U.S. Pat. No. 4,820,989 describes all identical compensation technique.

SUMMARY OF THE INVENTION

An object of the invention is to provide this compensation function in a simple and effective manner.

The invention provides a method of surveying a geological formation through which a cased borehole passes, said method being characterized by the fact that:

in a first step, current is injected into the casing at a first point spaced apart longitudinally from said formation so as to cause current to Icak into said formation, and electrodes defining two consecutive sections of casing situated at the level of said formation are used to measure the respective potential drops along said sections;

in a second step, current is injected into the casing at a second point spaced apart longitudinally from the formation and situated on the opposite side thereof from said first point, so as to cause current to leak into the formation, and said electrodes are used to measure the potential drops along said sections;

the corresponding measurements of the two steps are combined to obtain the values corresponding to a circuit formed by the casing between the two injection points and essentially exempt from leakage into the formation, and the current leakage that is indicative or the resistivity of the formation is determined on the basis of the measurements taken in the first step and in the second step, and of the values resulting from said combination.

BRIEF DESCRIPTION OF THE DRAWINGS

The invention will be well understood on reading the following description given with reference to the accompanying drawings, in which.

DETAILED DESCRIPTION OF THE INVENTION

The principle of measuring resistivity in a cased well consists in causing current to flow along the casing with a return that is remote, so as to enable current to leak towards the geological formations through which the well passes, and to evaluate the leakage current; at any given level down the well, the higher the conductivity of the formation surrounding the well at said level, the higher the leakage current. This can be expressed in mathematical terms by an exponentially decreasing relationship for the current flowing through the casing, with a rate of decrease, at any given level being a function of the ratio of formation resistivity Rt to casing resistivity Rc.

Figure 1:
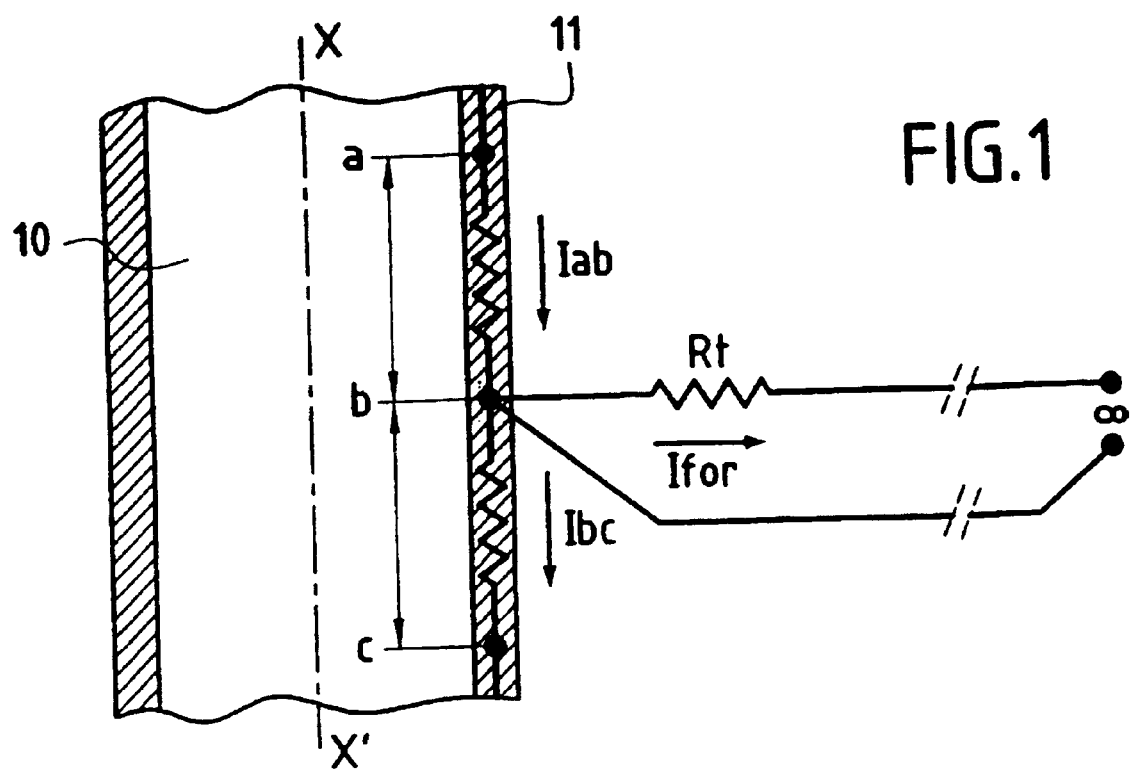
FIG. 1 summarizes the principle of measuring resistivity in a cased well.

The diagram in FIG. 1 shows a section of a well 10 having an axis X-X' and provided with metal casing 11. The desired level (or depth) at which the measurement is to be taken is referenced b. Consideration is given to a section of casing (a,c) extending on either side of the level b. If a current flows through the casing with a return that is remote (i.e. at surface level), the loss of current to the formation can be expressed in electrical circuit diagram terms by a shunt being placed between the level b or the casing and infinity. The resistance of the shunt is representative of the resistivity Rt of the formation at the level of the electrode b. Using Ohm's law, it is thus possible to write:

$$Rt = k(Vb, /Ifor) \quad [1]$$

where k is a geometric constant which can be determined by calibration measurements, Vb, is the potential of the casing at level b with a reference at infinity, and Ifor is the leakage current at level b.

By approximating a discrete variation, it is possible to describe a loss of current at level b as a difference between the input current at level b and the output current. The leakage current Ifor is thus expressed as the difference between the currents Iab and Ibc (which are assumed to be constant) flowing respectively in the casing sections (a,b) and (b,c):

$$Ifor = Iab - Ibc \quad [2]$$

or $$Ifor = Vab/Rab - Vbc/Rbc \quad [2']$$

where Vab and Rbc are the potential drops respectively along the section (a,b) and along the section (b,c) of the casing, and Rab and Rbc are the values of the resistance respectively of the section ab and of the section bc of the casing. It is assumed initially that the current applied to the casing is DC.

In view of the ratio between the resistivity of the casing and the usual resistivity values of the formations, which ratio lies in the range $10^7$ to $10^{10}$, the current loss over a length that corresponds to a resolution that is acceptable for a formation resistance measurement, e.g. in the range 30 cm to 1 m, is very small. The difference between the potential drops Vab and Vbc that can be ascribed to the current loss is therefore normally a very small quantity. As a result, uncertainties, even small uncertainties, concerning the terms of the difference have a major influence. For various reasons (localized corrosion, non-uniformness of the casing material, or variation in thickness), the resistance values per unit length of the casing sections (a,b) and (b,c) can differ from the value corresponding to the nominal characteristics of the casing, and above all can be different from each other. An uncertainty also affects the lengths of the casing sections (a,b) and (b,c) because said lengths depend on the positions of the contact points at which the electrodes are in contact with the casing, which positions are known only with relatively poor accuracy.

Figure 2:
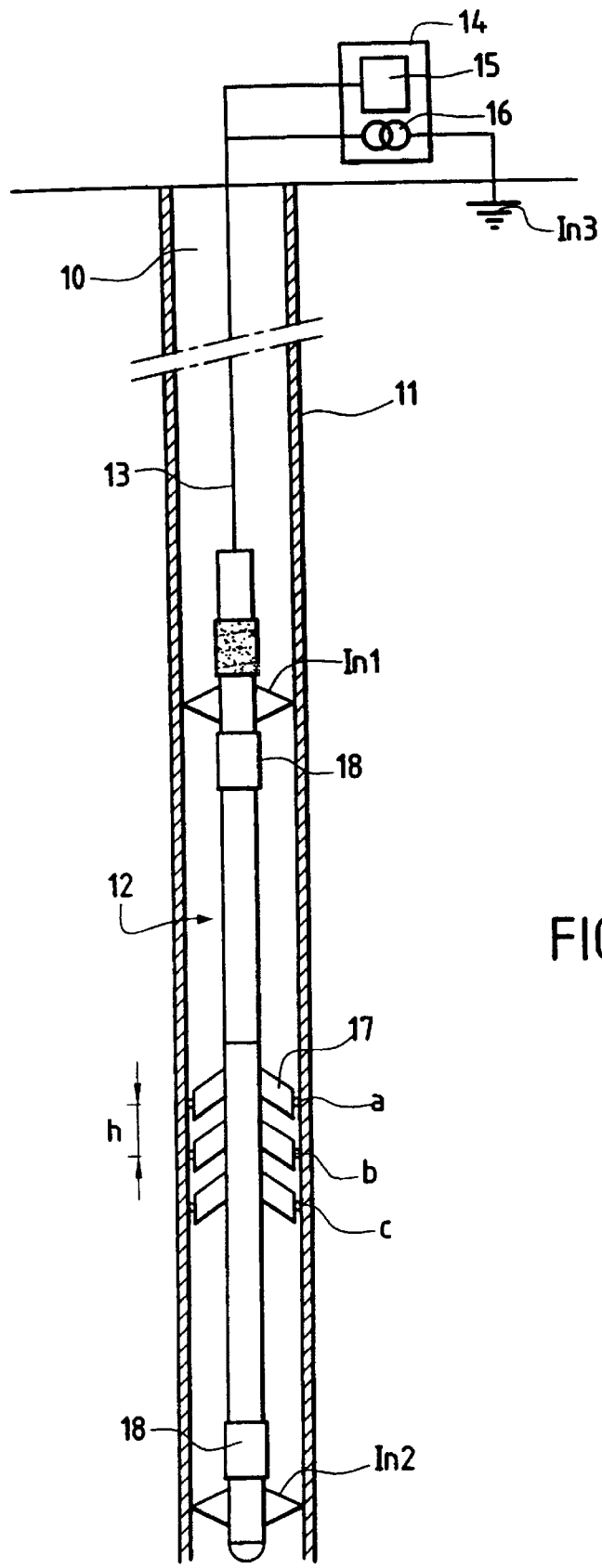
FIG. 2 diagrammatically shows downhole apparatus designed to implement said principle.

FIG. 2 diagrammatically shows apparatus for implementing the above-described principle.

The apparatus comprises a sonde 12 suitable for being moved in an oil borehole 10 provided with casing 11, and it is suspended from the end of an electrical cable 13 which connects it to surface equipment 14 comprising data acquisition and processing means and an electrical power supply 16. The sonde 12 is provided with three measurement electrodes a, b, and c which can be placed in contact with the casing, thereby defining casing sections (a,b) and (b,c) of length lying appropriately in the range 40 cm to 80 cm. In the embodiment shown, the electrodes a, b, and c are mounted on arms 17 hinged to the sonde 12. By means of mechanisms of known type that it is unnecessary to describe in detail herein, these arms may be swung out from the sonde so as to put the electrodes in contact with the casing, and then put back in the retracted position once the measurements have been finished. The electrodes are designed so that, once they are in contact with the casing, their positions remain as stationary as possible, and so that electrical contact with the casing is optimum.

A sonde of this type may be made on the basis of the instrument used commercially by Schlumberger for the "CPET" service, as indicated in Patent Document U.S. Pat. No. 5,563,514. That instrument, which is designed to evaluate the cathodic protection of casing and the state of corrosion thereof, is provided with twelve measurement electrodes distributed over four levels spaced apart in the longitudinal direction, the distance between levels being about 60 cm, and the three electrodes on each level being disposed symmetrically about the axis of the instrument, i.e. with angular spacing of 120° between adjacent electrodes.

To measure formation resistivity, three electrodes a, b, c suffice. But it is possible to use a larger number of levels, e.g., as in the above-mentioned instrument, four levels that call form two groups of three consecutive levels, so as to acquire more information and so as to take measurements corresponding to two different depths simultaneously. In such cases, each set of three consecutive electrodes is associated with the processing circuits described below. As regards the number of electrodes per level, a single electrode suffices.

The sonde is further provided with current electrodes disposed on either side of the electrodes a and c, namely a top electrode In1 and a bottom electrode In2, at distances from the electrodes a and c that may be of the same order or a little greater than the distance between the electrodes a and c, e.g. a few meters. Insulating fittings 18, such as fittings of the AH169 type commonly used by Schlumberger, are placed on either side of the central portion of the sonde, which central portion carries measurement electrodes a, b, and c, so as to isolate said central portion from the current electrodes In1 and In2. The current electrodes In1 and In2 may be made in the manner of conventional centralizers for cased wells. The wheels normally provided on such centralizers as elements that come into contact with the casing are then replaced by elements serving as current electrodes, and electrical conductors are provided for connecting to the electrode-forming elements.

The apparatus is also provided with a remote return electrode In3 preferably placed at surface level, at the well head (if the well is deep enough) or at some distance from the well head, and with means for feeding the current electrodes so as to establish the various circuits described below with reference to FIGS. 3A to 3C. The means comprise the above-mentioned surface current source 16, and, depending on the case, an additional source situated in the sonde, as well as suitable switching circuits.

Figure 3A:
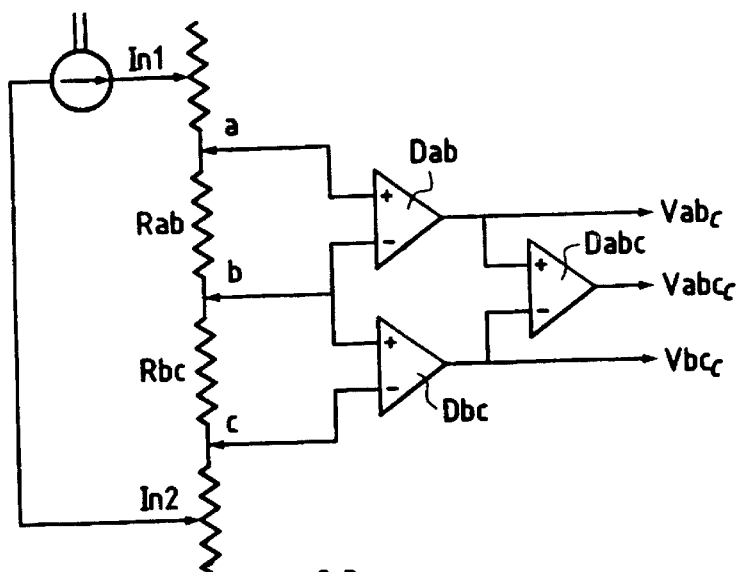
FIGS. 3A, 3B, and 3C show different operating states of the apparatus shown in FIG. 2.
Figure 3B:
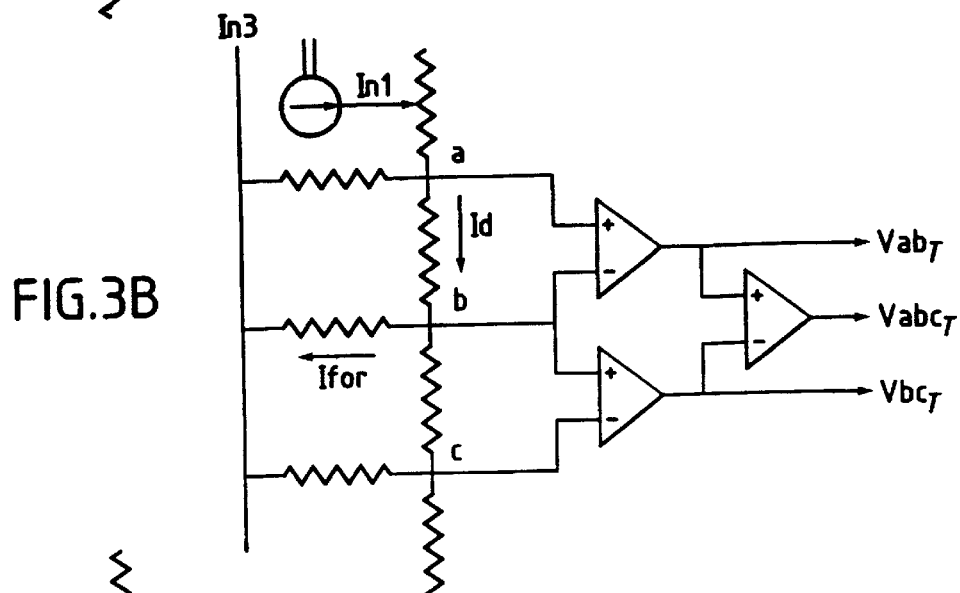
Figure 3C:
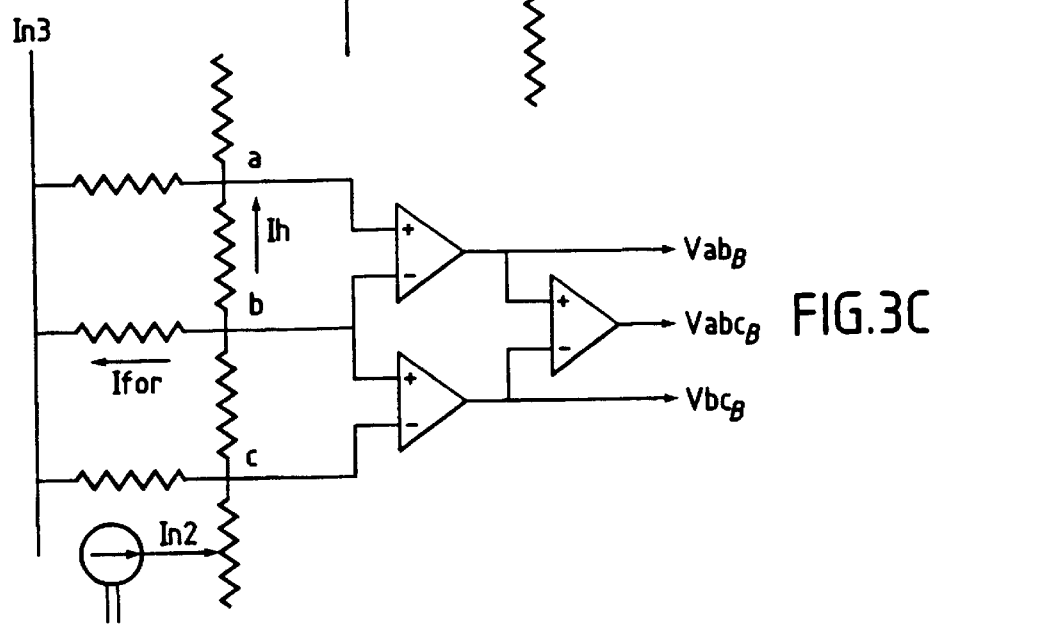

The diagrams given in FIGS. 3A to 3C show measurement steps corresponding to the various current-passing circuits that can be established by means of the abovedescribed apparatus. As explained below, two (or three) such steps suffice to obtain the desired results.

These diagrams show a processing circuit including amplifiers Dab and Dbc whose inputs are connected respectively to the electrodes a and b, and to the electrodes b and c, and which deliver at their outputs the voltage drops Vab and Vbc on the casing sections defined by the electrodes, and an amplifier Dabc connected to the amplifiers Dab and Dbc and delivering at its output the difference Vabc between the voltage drops Vab and Vbc. This circuit is preferably situated in the downhole sonde 12. It is supplemented by calculation means preferably belonging to the data acquisition and processing cleans of the surface equipment, which calculation means receive the voltages from the processing circuit and the other pertinent data and deliver the resistivity values Rt. The data is transmitted conventionally via the cable 13 in digital form, an analog-to-digital converter (not shown) being provided in the sonde 12 and connected to the processing circuit.

The step shown in FIG. 3A calibrates the measurement system formed by the measurement electrodes a, b, and c and the casing sections 11 that they define.

In this step, a current is applied to the casing by means of the circuit formed by In1 as injection electrode and by In2 as near return electrode, by placing the switching circuits in the appropriate position. In this way, the current substantially does not penetrate into is the formation surrounding the well. The current is preferably low-frequency AC, e.g. having a frequency in the range 1 Hz to 5 Hz, but the reasoning below assumes that the current is DC.

With the applied current being referenced It, the outlet voltages of the amplifiers are as follows:

$$Vab_C = Rab.It \quad [3]$$

$$Vbc_C = Rbc.It \quad [3']$$

$$Vabc_C = (Rab-Rbc).It \quad [3'']$$

The step shown in FIG. 3B uses a current-application circuit made up or a top electrode In1 and of the remote electrode In3, the applied current being of the same type as in the first step, namely AC of the same frequency. Under these conditions, current leakage is produced as described above with reference to FIG. 1, which leakage is a function of the resistivity of the formation at the level of the electrode b. With the current flowing downwards through the casing sections (a,b) and (b,c) being referenced Id, and the leakage current being referenced Ifor as above, the output voltages of the amplifiers are as follows:

$$Vab_T = Rab.Id \quad [4]$$

$$Vbc_T = Rbc(Id-Ifor) \quad [4']$$

$$Vabc_T = (Rab-Rbc).Id + Rbc.Ifor \quad [4'']$$

By combining these expressions, it is possible to deduce the leakage current Ifor;

$$Ifor = It.[Vabc_T - (Vabc_C.Vab_T/Vab_C)]/(Vab_C - Vabc_C) \quad [5]$$

The step shown in FIG. 3C differs from the step in FIG. 3B only in that the bottom electrode In3 is used instead of the top electrode In1 to apply current, the return being provided by the surface electrode In3, As in the step in FIG. 3B, current therefore leaks to the formation, but the current flows upwards through the casing sections (a,b) and (b,c). This current is referenced Ih and the voltages obtained are referenced $Vab_B$, $Vbc_B$, and $Vabc_B$.

It should be noted that, by virtue of the principle of superposition, the current circuit shown in FIG. 3A and made tip of the electrodes In1 and In2 is equivalent as regards the electrical magnitudes (current and voltage) to the difference between the circuit shown in FIG. 3B and the circuit shown in FIG. 3C, if the current applied respectively by the electrodes In1 and In2 is the same. Hence symbolically:

CIRCUIT 3A=CIRCUIT 3B–CIRCUIT 3C

The current and voltage values in above expression [5] and corresponding to the step shown in FIG. 3A may thus be replaced, in accordance with the invention, with the differences between the corresponding values obtained respectively in the steps shown in FIGS. 3B and 3C: thus, $Vab_C = Vac_T - Vac_B$, etc. That makes it possible to replace the step shown in FIG. 3A with the step shown in FIG. 3C. The advantage of this solution is that the current application circuit is simplified. In this respect, it should be noted that the step shown in FIG. 3A requires either a current source in the downhole sonde, or a current source on the surface and connected to two additional strands in the cable 13.

In order to determine the formation resistivity Rt, once the leakage current Ifor has been calculated in this way, there remains the task of determining the potential of the casing relative to a reference at infinity Vb, , as explained above. This is performed as described in the above-mentioned literature, by means of a reference electrode which may be placed on the surface, remote from the surface return electrode In3, or preferably situated in the well, e.g. on the insulated cable portion or "bridle" connecting the downhole apparatus to the cable. It is thus possible to measure the potential difference Vbs between the casing at the level of the measurement electrode b and the reference electrode. Using the above-mentioned equation [1], the ratio K.Vbs/Ifor is formed, where K is the above-mentioned constant, so as to deduce the formation resistivity Rt. This measurement of the voltage Vbs cannot be performed simultaneously with the other above-mentioned measurements because of coupling phenomena in the cable.

What is claimed is:

1. A method of surveying a geological formation through which a cased borehole passes, said method being characterized by the fact that:

in a first step, current is injected into the casing (11) at a first point (In1) spaced apart longitudinally from said formation so as to cause current to leak into said formation, and electrodes (a, b, c) defining two consecutive sections of casing situated at the level of said formation are used to measure the respective potential drops along said sections;

in a second step, current is injected into the casing at a second point (In2) spaced apart longitudinally from the formation and situated on the opposite side thereof from said first point, so as to cause current to leak into the formation, and said electrodes are used to measure the potential drops along said sections;

the corresponding measurements of the two steps are combined to obtain the values corresponding to a circuit formed by the casing between the two injection points and essentially exempt front leakage into the formation; and the current leakage that is indicative of the resistivity of the formation is determined on the basis of the measurements taken in the first step and in the second step, and of the values resulting from said combination.

2. A method according to claim 1, in which the first injection point is situated above the formation, and the second injection point is situated below said formation, and the combination consists in subtracting the measurements of the second step from the measurements of the first step.

* * * * *